United States Patent [19]

Beach et al.

[11] Patent Number: 5,416,042
[45] Date of Patent: May 16, 1995

[54] METHOD OF FABRICATING STORAGE CAPACITORS USING HIGH DIELECTRIC CONSTANT MATERIALS

[75] Inventors: David B. Beach, Knoxville, Tenn.; Alfred Grill, White Plains; Christopher J. Smart, Wappingers Falls, both of N.Y.

[73] Assignee: International Business Machines Corporation, Armonk, N.Y.

[21] Appl. No.: 257,396

[22] Filed: Jun. 9, 1994

[51] Int. Cl.$^6$ ............................................ H01L 21/70
[52] U.S. Cl. ...................................... 437/60; 437/919;
437/52; 148/DIG. 14; 257/295; 361/321.1;
365/145
[58] Field of Search ............................ 437/919, 60, 52;
148/DIG. 14; 257/295, 310; 361/321.1;
365/145

[56] References Cited

U.S. PATENT DOCUMENTS

| | | | |
|---|---|---|---|
| 4,577,213 | 3/1986 | Bauhahn . | |
| 5,046,043 | 9/1991 | Miller et al. | 365/145 |
| 5,060,191 | 10/1991 | Nagasaki et al. | 365/145 |
| 5,070,026 | 12/1991 | Greenwald et al. | 437/3 |
| 5,079,199 | 1/1992 | Ochi et al. | 501/135 |
| 5,081,706 | 1/1992 | Kim . | |
| 5,104,690 | 4/1992 | Greenwald | 427/126.3 |
| 5,119,154 | 6/1992 | Gnadinger | 357/23.6 |
| 5,155,658 | 10/1992 | Inam et al. | 361/321 |
| 5,164,808 | 11/1992 | Evans et al. | 361/305 |
| 5,191,510 | 3/1993 | Huffman | 361/313 |
| 5,192,704 | 3/1993 | McDavid et al. | 437/52 |
| 5,313,089 | 5/1994 | Jones | 257/295 |
| 5,330,931 | 7/1994 | Emesh et al. | 437/60 |
| 5,337,207 | 8/1994 | Jones et al. | 361/321.1 |
| 5,350,705 | 9/1994 | Brassington et al. | 437/60 |
| 5,352,622 | 10/1994 | Chung | 437/60 |

FOREIGN PATENT DOCUMENTS

0078200A1 10/1982 European Pat. Off. .
01-289232 11/1989 Japan .
01-289232 11/1989 Japan .

OTHER PUBLICATIONS

IBM Technical Disclosure Bulletin vol. 37, #6A, Jun. 1994, p. 93.

*Primary Examiner*—Tom Thomas
*Assistant Examiner*—Leon Radomsky
*Attorney, Agent, or Firm*—Robert P. Tassinari, Jr.

[57] ABSTRACT

A storage capacitor having high dielectric constant materials and a method for forming same are described. The method solves the problems associated with fabrication of planar capacitors for DRAM chips constructed from inorganic oxides with perovskite structure. These materials are not readily etched by conventional ion etching techniques. These materials also react with silicon and silicon dioxide and the disclosed process avoids these interactions.

6 Claims, 2 Drawing Sheets

METHOD OF FABRICATING STORAGE CAPACITORS USING HIGH DIELECTRIC CONSTANT MATERIALS

FIELD OF THE INVENTION

This invention relates to memory devices, and more particularly to a method for fabricating planar capacitors for DRAM chips.

BACKGROUND OF THE INVENTION

Expansion of dynamic random access memories (DRAMs) to higher densities, to one Gbit or higher integration, requires materials of high dielectric constants, in order to be able to construct sufficiently large capacitors in the reduced available surface area on an integrated circuit chip.

Compound oxide type materials, especially ferroelectric or paraelectric materials such as $Ba_xSr_{(1-x)}TiO_3$ or $PbZr_xT_{(1-x)}O_3$ (PZT) appear to be among the materials having sufficiently high dielectric constants as required by one Gbit DRAMs. These materials must be deposited on electrodes in electrical contact to semiconductor regions such as silicon or alloys thereof. The high dielectric materials can be deposited by a variety of methods, which often involve heating the temperatures above 500 degrees C. at a certain stage. The materials can also be exposed to higher temperatures during fabrication of the devices.

The processing of the capacitor structure should maintain the integrity of the device, and interaction between the high dielectric material and the components of the substrates on which it is deposited should therefore be avoided. Interaction with silicon and silicon dioxide should specifically be prevented.

SUMMARY OF THE INVENTION

The present invention provides a method for fabricating storage capacitors using high dielectric constant substrate materials. The substrate has regions of silicon dioxide and of silicon on its upper, planar surface. The method includes forming a barrier layer of a material, other than silicon dioxide, over the upper surface of the substrate, the layer having a thickness equal to the sum of the thickness of a lower electrode and a high-dielectric constant material to be subsequently formed. Next, a resist layer is formed over the barrier, and a pattern having openings above selected ones of the silicon regions is formed in the resist layer. The barrier layer below the openings in the resist is removed to expose the selected silicon regions, and a conductive layer is formed over the patterned resist layer and the selected silicon regions to form the lower electrode of the capacitors. The resist layer and the conductive layer over the resist layer are removed to expose the barrier layer. A layer of high-dielectric constant material is formed over the conductive layer and over the patterned barrier layer, the dielectric constant of the material being greater than about 400. The high dielectric layer is chemical-mechanically polished to remove the high dielectric layer above the barrier layer and to form a substantially planar surface having an upper surface of the patterned barrier layer and regions of high-dielectric constant material above the conductive layer in openings of the patterned barrier layer. Finally, an upper electrode is formed on the upper surface above respective regions of the high-dielectric constant material.

The foregoing process yields a plurality of high-dielectric constant capacitors on a substrate, the structure comprising first regions of silicon spaced apart on the upper surface of the substrate, and second regions of silicon dioxide positioned between the first regions. The first and second regions form a substantially planar upper surface. A barrier layer is formed over the upper surface, the layer having openings to expose a substantial portion of the first regions of silicon. A layer of conductive material is formed in each of the openings over the first regions of silicon to form the bottom electrodes of the capacitors. A layer of high-dielectric constant material, where $\epsilon$ is greater than about 400, is formed in each of the openings over the layer of conductive material, the layer of high-dielectric constant material substantially filling each of the openings and having an upper surface substantially coplanar with the upper surface of the barrier layer to form the dielectric portion of the capacitors. Finally, an upper electrode is formed on the upper surface of each high-dielectric constant material to form the top electrodes of the capacitors.

FIGURES

FIGS. 3A–3G sequentially depict a method of fabricating a planar DRAM capacitor in accordance with the present invention.

DESCRIPTION OF THE PREFERRED EMBODIMENTS

Figure 1:
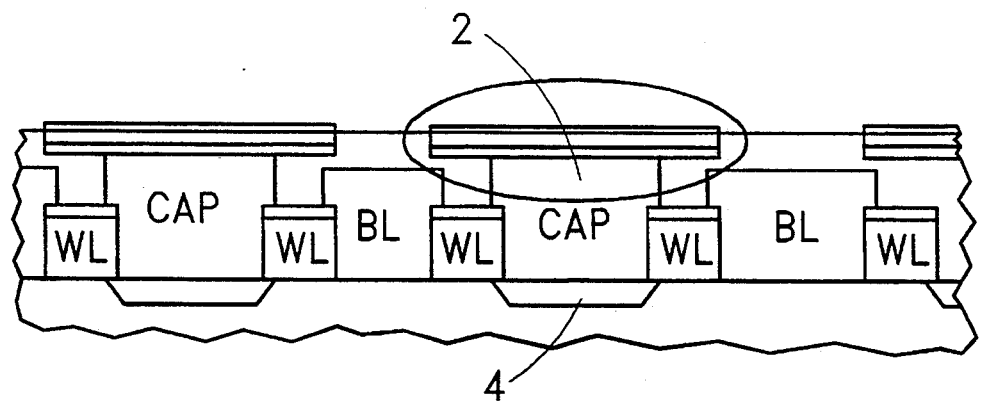
FIG. 1 is a cross-sectional view of a set of planar DRAM capacitors in accordance with the present invention.
Figure 2:
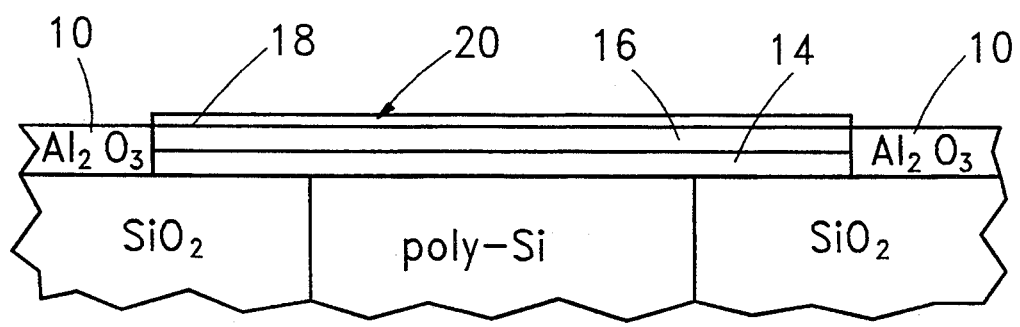
FIG. 2 is an enlarged view of the circled area of FIG. 1.

FIG. 1 depicts schematically a set of planar DRAM capacitor cells. An enlarged view of the circled area of FIG. 1 is shown in FIG. 2. The capacitor 2 (FIG. 1) consists of a plug of doped polysilicon (or other conductor) contacting gate oxide (4) on the bottom and a conductive layer 14 (FIG. 2) (bottom electrode) on the top. Above the bottom electrode is a high-dielectric constant material 16. Word lines WL and bitlines BL are shown in FIG. 1. This invention consists of a method for making this structure while avoiding deleterious material interaction.

Figure 3A:
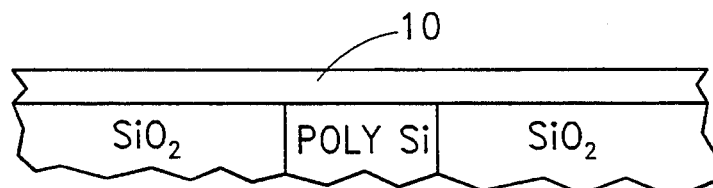

The method of fabricating the planar DRAM capacitor of the present invention is shown in FIGS. 3A–3G. It is assumed the structure up to the deposition of the bottom electrode has been completed by any suitable process known in the art. As shown in FIG. 3A, the first step is the deposition of a layer 10 of alumina ($Al_2O_3$) deposited by any means now known or hereafter developed (the surface is assumed to be planar). For example, deposition can be by means of sputtering, chemical vapor deposition (CVD), or any other suitable technique. The preferred means for deposition is sputtering. Alternatives to alumina are zirconia ($ZrO_2$) and titania ($TiO_2$). The layer is between 1000 Å and 3000 Å thick, preferably 2000 Å. The thickness of the alumina layer 10 is the sum of the thickness of the bottom electrode (14 in FIG. 2) and the annealed thickness of the dielectric layer (16 in FIG. 2). The purpose of the alumina layer is to act as a barrier, i.e., to prevent reaction of the dielectric material with silicon dioxide. We have observed gross changes in the surface morphology of silicon dioxide following deposition and annealing of lead-based dielectric layers. We believe that the interaction of the lead dielectric with silicon dioxide would make further processing impossible, and its presence at the sidewall of the capacitor would lead to reliability problems.

Figure 3B:
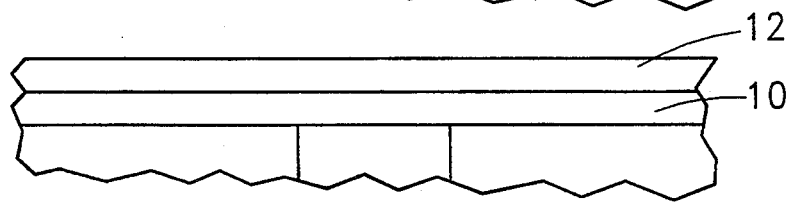
Figure 3C:
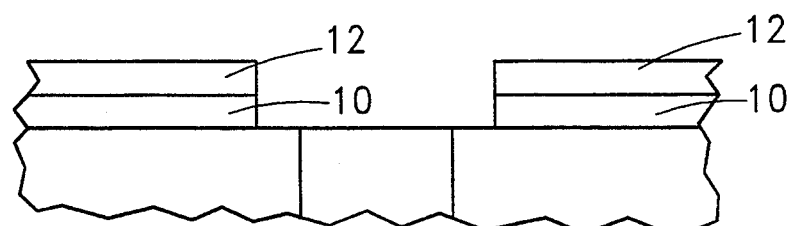
Figure 3D:
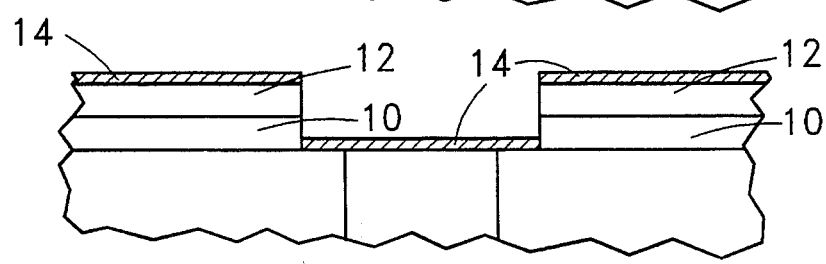
Figure 3E:
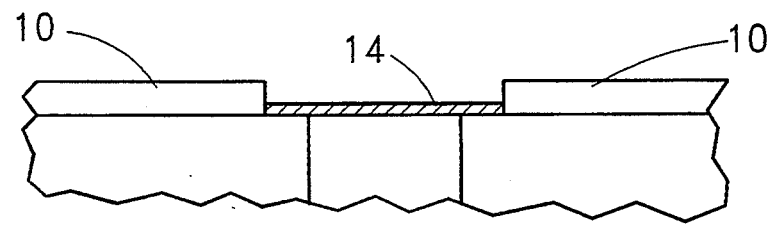

Next, referring to FIG. 3B, a photoresist 12 is applied and exposed. The resist 12 and the alumina layer 10 are then etched above the polysilicon region, as shown, using standard RIE techniques to form the structure of FIG. 3C. As can be seen from FIG. 3C, the etching may be expanded laterally to expose portions of the $SiO_2$ as well. Next, a layer of metal and/or conductive metal oxide 14 is deposited on the resist 12 and the exposed polysilicon and $SiO_2$, as shown in FIG. 3D. The resist is then wet stripped to leave the metal electrode 14 at the bottom of the patterned alumina barrier as in FIG. 3E. This "lift-off" technique can be used in this case because of the shallow aspect ratio of the capacitor. The capacitor size for a 256 M DRAM would be approximately the cell area, or $0.25 \times 0.75$ μm, indicating that the aspect ratio would be less than 1.

Figure 3F:
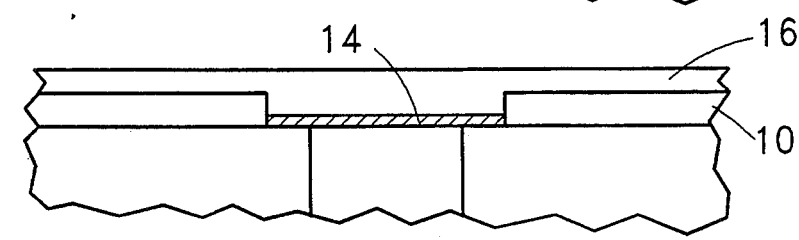
Figure 3G:
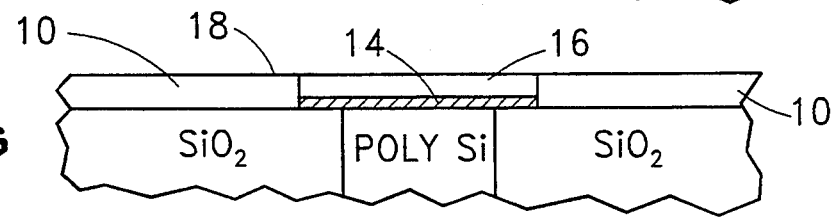

Next, a high dielectric material 16 is formed on the structure. The preferred method of doing so is to spin a sol-gel lead-based dielectric material 16 on to the structure (FIG. 3F). The material 16 preferably has a dielectric constant $\epsilon$ greater than 400. Alternatively, the sol-gel dielectric can be deposited by CVD. This dielectric material can be lead titanate, lead-zirconium titanate, lead lanthanum zirconium titanate (PLZT), lead magnesium niobate, as well as, barium titanate, barium-strontium titanate, or any equivalent material. The excess material is removed by chem-mech polishing to produce a planar surface 18, as shown in FIG. 3G.

A top electrode (20 in FIG. 2) is then deposited on the dielectric to connect the capacitor into the electrical circuit of the device.

Thus, while the invention has been particularly shown and described with respect to preferred embodiments thereof, it will be understood by those skilled in the art that changes in form and details may be made therein without departing from the scope and spirit of the invention.

Having thus described our invention, what we claim as new and desire to secure by Letters Patent is:

1. A method of forming a plurality of high dielectric capacitors on a substrate having regions of silicon dioxide and regions of silicon on the upper surface of said substrate, said upper surface being substantially planar, comprising the steps of:

forming a barrier layer, other than silicon dioxide, over the upper surface, the barrier layer having a thickness equal to the sum of the thickness of a lower electrode and a high-dielectric constant material to be subsequently formed;

forming a resist layer over the barrier layer;

forming a pattern in the resist layer, the pattern having openings above selected ones of the silicon regions;

removing the barrier layer below the openings in the resist to expose the selected silicon regions;

forming a conductive layer over the patterned resist layer and the selected silicon regions to form the lower electrode of the capacitors;

removing the resist layer and the conductive layer over the resist layer to expose the barrier layer;

forming a layer of high-dielectric constant material, where $\epsilon$ is greater than about 400, over the conductive layer and the patterned barrier layer;

chemical-mechanically polishing the high dielectric layer to remove the high dielectric layer above the barrier layer and to form a substantially planar surface having an upper surface of the patterned barrier layer and regions of high-dielectric constant material above the conductive layer in openings of the patterned barrier layer; and forming an upper electrode on the upper surface above respective regions of the high-dielectric constant material.

2. The method of claim 1 wherein the barrier layer is formed using a material selected from the group consisting of $Al_2O_3$, $ZrO_2$ and $TiO_2$.

3. The method of claim 2 wherein the step of forming a barrier layer comprises the step of sputtering the barrier material.

4. The method of claim 1 wherein the step of forming a layer of high-dielectric constant material comprises the step of forming an inorganic oxide with a perovskite structure selected from the group consisting of lead titanate, lead zirconium titanate, lead lanthanum zirconium titanate, lead magnesium niobate, barium titanate, and barium-strontium titanate.

5. The method of claim 1 wherein said step of forming a layer of high-dielectric constant material comprises the step of spin coating, drying and annealing a sol-gel high-dielectric constant material.

6. The method of claim 1 wherein the step of forming a layer of high-dielectric constant material comprises the step of chemical vapor depositing (CVD) a high-dielectric constant material.

* * * * *